United States Patent [19]

Knowles et al.

[11] Patent Number: 4,710,707
[45] Date of Patent: Dec. 1, 1987

[54] HIGH VOLTAGE ELECTRONIC COMPONENT TEST APPARATUS

[75] Inventors: Terence J. Knowles, Lincolnshire; Francis M. Ray, Glenview; Charles E. Shewey, Mundelein, all of Ill.

[73] Assignee: Zenith Electronics Corporation, Glenview, Ill.

[21] Appl. No.: 692,583

[22] Filed: Jan. 16, 1985

[51] Int. Cl.$^4$ .............................. G01R 19/15
[52] U.S. Cl. .................. 324/158 F; 324/158 R
[58] Field of Search ............... 200/149 A, 149 R; 324/158 R, 158 P, 158 F, 73 PC; 336/84 R, 84 C

[56] References Cited

U.S. PATENT DOCUMENTS

| 611,719 | 10/1898 | Tesla | 200/149 R |
|---|---|---|---|
| 3,268,698 | 8/1966 | Bober et al. | 200/149 A |
| 3,715,662 | 2/1973 | Richelmann | 324/158 F |
| 3,851,287 | 11/1974 | Miller et al. | 336/84 C |
| 4,466,746 | 8/1984 | Hancock et al. | 324/73 PC |

FOREIGN PATENT DOCUMENTS

| 0466632 | 8/1975 | U.S.S.R. | 324/158 F |
|---|---|---|---|
| 0886345 | 11/1981 | U.S.S.R. | 324/158 R |

OTHER PUBLICATIONS

"Probe Cap for Liquid Encapsulated Modules", by Lockwood et al., IBM Tech. Disc. Bull., vol. 22, #6, 11/79, pp. 2343-2344.

Primary Examiner—Reinhard J. Eisenzopf
Assistant Examiner—W. Burns
Attorney, Agent, or Firm—Cornelius J. O'Connor; Thomas Hill

[57] ABSTRACT

A high voltage electronic component test apparatus includes a test chamber containing a pair of electrodes across which a high voltage is applied and between which a component is placed in circuit by means of a movable component gripper assembly for the testing thereof. Voltage generating and electrical measurement apparatus is coupled to the electrodes for applying a high voltage thereacross and for measuring the resulting current within the electronic component. From the component testing, the remotely operated gripper assembly then removes the tested component from the test chamber and introduces another component for testing therein. A closed, circulating liquid-vapor system coupled to the test chamber introduces an electrically inert vapor, such as Freon or a fluorinated hydrocarbon, into the test chamber to prevent arcing and eliminate leakage currents therein. The dielectric vapor condenses on the cooled inner walls of the test chamber, collects as a liquid in a lower portion thereof, and flows under gravity to a reservoir where it is heated and returned to the test chamber in vapor form in a continuously circulating manner. The test apparatus of the present invention is capable of measuring currents in the nano-ampere range at kilovolt test voltages.

13 Claims, 3 Drawing Figures

HIGH VOLTAGE ELECTRONIC COMPONENT TEST APPARATUS

BACKGROUND OF THE INVENTION

This invention relates generally to the testing of electronic apparatus and is particularly directed to a high voltage test chamber for testing electronic components and modules.

The high speed testing of electronic components is commonly used to ensure quality control in production runs. Each component is typically subjected to at least one test procedure, and frequently more, in order to determine its electrical characteristics under various operating conditions. For example, the leakage current within a diode across which is applied a predetermined voltage may be measured for determining the blocking characteristics of the diode. The charge capacity of a capacitor or the resistance of a resistor may be measured with a given voltage applied thereacross in accepting or rejecting the components in a production lot. The tendency today is for increased production lot testing in the form of more individual component tests as well as the high speed testing of increased numbers of components within a given production lot for ensuring higher component reliability.

In order to prevent arcing, a dielectric medium is typically provided within the test chamber to reduce an electric field in the space between the electrodes across which the high voltage is applied and with which the electronic component is placed in circuit. Prior art approaches have generally made use of a dielectric in liquid form for providing this isolation. The use of a liquid dielectric, while providing desirable electrical characteristics in the test chamber, generally complicates the test procedure. For example, following submersion in the liquid dielectric, the dielectric must generally be removed from the surface of the component, generally by means of a drying process or a rinse-and-dry process. This involves additional components, e.g., a heater and/or a blower, in the test procedure. Since this drying process is typically accomplished outside of the test chamber, the liquid dielectric or rinse solvent which evaporates from the components is lost and generally enters the atmosphere. In addition, submersion of the components within the liquid dielectric and their removal from the test chamber results in additional dielectric loss as some of the liquid dielectric remains upon the components and is removed from the test chamber. The loss of liquid dielectric by either of the aforementioned causes is not only undesirable from an environmental standpoint, but also is economically unacceptable particularly where relatively expensive dielectric materials such as Freon and various fluorinated hydrocarbons are utilized.

Finally, prior art approaches utilizing liquid dielectrics suffer from limitations arising from spurious electric leakage currents, particularly from contamination of the dielectric. These contaminants may be carried and introduced into the dielectric liquid by the electronic components themselves. Once suspended in the liquid dielectric, its high voltage leakage current characteristics become irregular and unpredictable resulting in reduced test result reliability. Perhaps the most bothersome contaminant is water which can enter the test chamber by various means and which can substantially change the voltage isolation characteristics of the dielectric material.

The present invention represents an improvement over the prior art by providing a high voltage test apparatus for electronic components wherein an electrically inert vapor is continuously circulated through a test chamber to prevent arcing and stray electrical currents therein during the testing of a component. The present invention maintains contaminants within the test environment to a minimum, virtually eliminates loss of the dielectric vapor from the test apparatus, and eliminates arcing and stray currents within the test chamber even at very high test voltages to permit the accurate measurement of even very small currents within the component under test.

Objects of the Invention

Accordingly, it is an object of the present invention to provide an arrangement for the safe, accurate and high speed testing of electronic components and modules under high voltage conditions.

It is another object of the present invention to provide a high voltage electronic component test arrangement having a closed, circulating dielectric vapor system for reducing the possibility of electrical arcing and for minimizing leakage currents.

Yet another object of the present invention is to provide a high voltage test arrangement for electronic components utilizing a dielectric medium which substantially reduces sources of inaccurate measurements arising from dielectric contamination.

A further object of the present invention is to provide a high voltage test chamber particularly adapted for the automatic, high speed testing of electronic components.

A still further object of the present invention is to provide a test environment for testing electronic components under very high voltage conditions, e.g., greater than 20 kilovolts, wherein extremely small currents, e.g., on the order of nano-amperes, may be accurately measured.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENT

Figure 1:
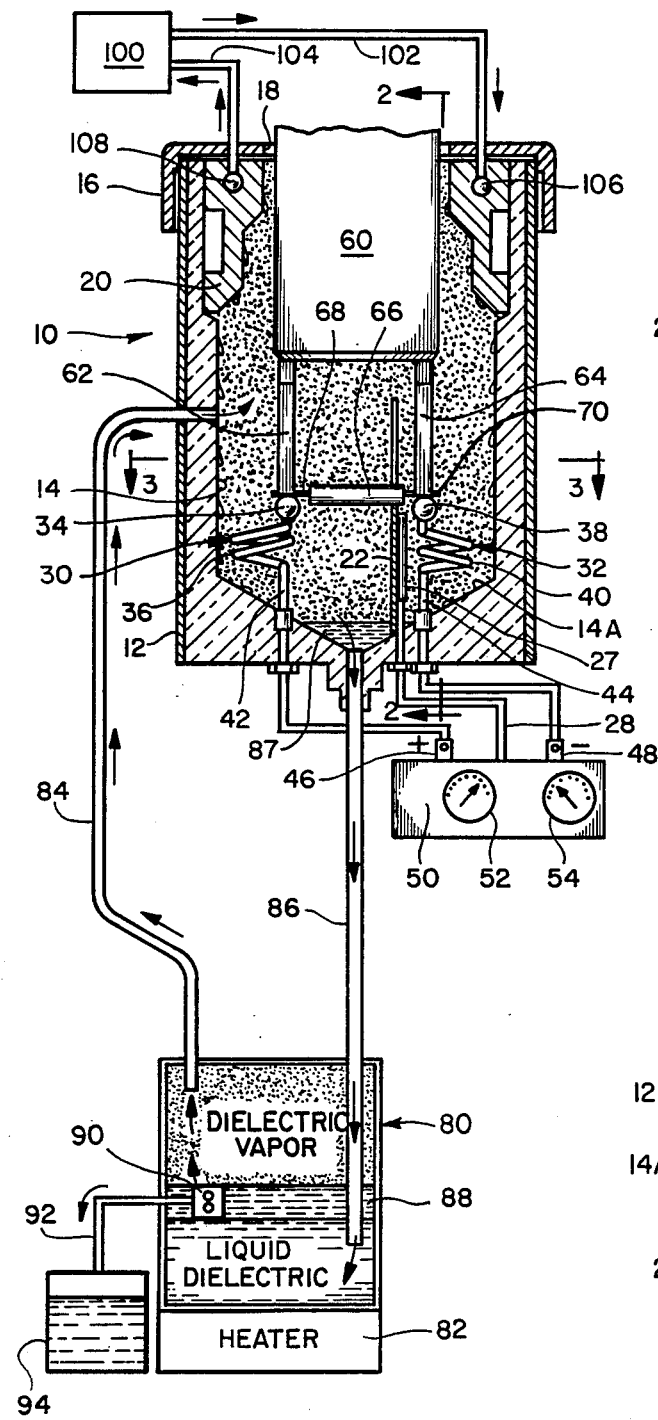
FIG. 1 is a simplified schematic diagram of a high voltage electronic component test apparatus in accordance with the present invention.
Figure 2:
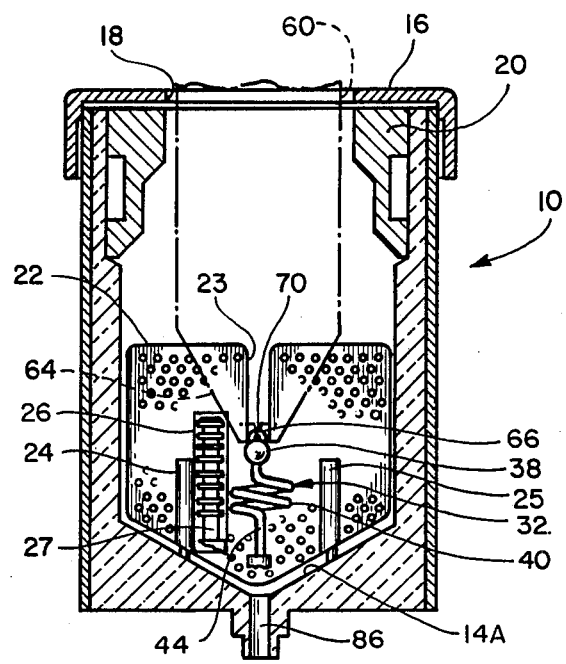
FIG. 2 is a sectional view of a portion of the high voltage electronic component test apparatus of FIG. 1 taken along sight line 2—2 therein.
Figure 3:
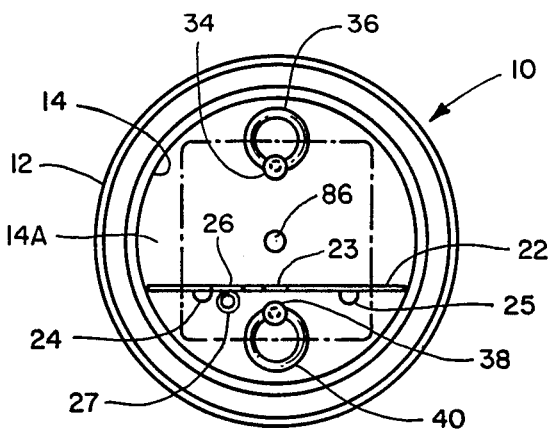
FIG. 3 is a sectional view of the high voltage electronic component test apparatus of FIG. 1 taken along sight line 3—3 therein.

Referring to FIGS. 1, 2 and 3, there are shown various views of a high voltage electronic component test apparatus 10 in accordance with the present invention.

The high voltage test apparatus 10 includes a housing 12 having a generally cylindrical shape in a preferred embodiment. Within the housing 12 is provided a generally cylindrical test chamber 14 formed of electrically insulating material extending substantially the entire length of the housing which is open at the top. An upper, inner portion of the housing 12 is provided with an upper insert, or condensation hat, 20 having an aperture in the center thereof and providing the test chamber 14 with a generally concave upper, inner surface. Positioned upon an upper portion of the housing 12 and the upper insert 20 is a lid, or cover, 16 having an aperture 18 in the center thereof. The test chamber 14 is thus open at the top thereof.

Positioned within the test chamber 14 of the housing 12 are positive and negative electrodes 30, 32 across which is applied a voltage for testing the electrical characteristics of an electronic component 66 positioned across these electrodes. The positive electrode 30 includes a positive contact 34 positioned on the upper end of a conductive spring element 36 which, in turn, is coupled by means of a positive lead 42 to the positive terminal 46 of a voltage generating and electrical measurement apparatus 50. Similarly, the negative electrode 32 includes a negative contact 38 positioned on the upper end of a spring element 40 which, in turn, is coupled by means of a negative lead 42 to the negative, or grounded, terminal 48 of the voltage generating and electrical measurement apparatus 50. From FIG. 1, it can be seen that the lower portion of the housing 12 is provided with a pair of apertures, or channels, through which the positive and negative leads 42 and 44 are run.

The voltage generating and electrical measurement apparatus 50 applies a voltage across the positive and negative electrodes 30, 32 and measures the current within an electronic component coupled across the positive and negative contacts 34, 38. The present invention may thus be used to measure the leakage current within a diode, the capacitance of a capacitor or the resistance of a resistor. Various other applications for measuring the electrical characteristics of virtually any electronic component will readily come to mind to those skilled in the relevant arts. The voltage generating and electrical measurement apparatus 50 may be provided with a voltage display 52 as well as a current display 54 for providing a visual indication of the voltage applied across the contacts and the current carried by the component under test in response to the applied voltage. Processing this information so that parts may be automatically segregated or classified will be obvious to those skilled in the art. The voltage generating and electrical measurement apparatus 50 may be conventional in design and operation, with the details thereof not forming a part of the present invention and thus not further described herein.

The upper, open portion of the housing 12 is adapted to receive an electrical component carrying apparatus for introducing the component into the high voltage test chamber 14 for electrical testing therein. For example, a robotic component gripper assembly 60 engaging an electronic component 66 in a lower portion thereof may be inserted within the high voltage test chamber 14 for testing the electronic component. The component gripper assembly 60 would typically be provided with first and second sets of movable pincers 62, 64 for respectively engaging the first and second axial leads 68, 70 of the electronic component 66. In addition, each of the first and second pincers 62, 64 is adapted for firm engagement with a respective electrical contact by means of which a predetermined voltage as established by the voltage generating and electrical measurement apparatus 50 is applied across the component 66 to permit the measurement of an electrical characteristic of the component. Following testing of the component 66 within the high voltage test chamber 14, the component gripper assembly 60 is displaced upwards so as to remove the component from the test chamber, deposits the tested component in accordance with the next succeeding process step, and engages another electronic component for positioning and testing within the high voltage test chamber. The spring element portions 36, 40 respectively provide the positive and negative electrodes 30, 32 with a degree of resilience upon impact with the first and second pincers 62, 64, respectively. The respective spring elements of each of the electrodes thus ensures that following initial impact of an electrode contact with a pincer element of the component gripper assembly 60, electrical contact is maintained between the contacts and the conductive pincer elements for applying a voltage across an electronic component engaged thereby.

The lower portion of the test chamber 14 is generally shaped in the form of a funnel and includes an aperture in the lowest portion thereof. Coupled to the aperture is one end of an outlet tube 86. The other end of the outlet tube is inserted within a dielectric reservoir 80. The dielectric reservoir 80 is also coupled to the housing 12 of the high voltage test chamber 14 by means of an inlet tube 84. The dielectric reservoir 80 in combination with the test chamber 14 within the housing 12 forms a substantially closed, circulating system for providing a continuous stream of dielectric vapor to the test chamber 14 for maintaining electrical isolation between the positive and negative electrodes 30, 32 in the following manner.

The dielectric reservoir 80 contains a dielectric, such as Freon or a fluorinated hydrocarbon, and includes a heater 82 adjacent thereto. The heater 82 heats up the liquid dielectric and converts it to vapor form for transit through the inlet tube 86 to the test chamber 14. The vaporized dielectric fills the test chamber 14 and provides a high degree of electrical isolation between the positive and negative electrodes 30, 32 in order to prevent arcing and minimize leakage currents within the test chamber. Water may be introduced into the test chamber 14 from a variety of sources such as the atmosphere or moisture condensation upon the electronic components being tested. Water represents a contaminant in the high voltage test procedure in that it affects the dielectric properties of the environment within the test chamber 14 and provides an external ourrent path when deposited upon the outer surface of a component. Since most suitable dielectric materials are more dense than water, moisture removed from the test chamber via the outlet tube 86 will collect on the upper surface of the liquid dielectric therein. This water may be removed by the combination of a float mechanism 90 positioned on the surface of the liquid dielectric having apertures therein and coupled by means of a drain tube 92 to a water collection tank 94. In this manner, the water may be drained off of the upper surface of the liquid dielectric and removed from the dielectric reservoir 80. Since water is generally less dense than most suitable dielectrics in liquid form, water may also be removed from the dielectric reservoir 80 by merely providing an opening in the upper portion thereof to permit the heated water to escape therefrom in the form of vapor. The size of the aperture (not shown) within the upper portion of the dielectric reservoir 80 as well as the degree to which the dielectric and water are heated by means of the heater 82 may be selected to permit the water vapor to escape from the dielectric reservoir 80 while substantially confining the escape of the dielectric vapor therefrom to the inlet tube 84.

The dielectric vapor is introduced into the test chamber 14 via the inlet tube 84 and condenses upon the various surfaces of the test chamber which are unheated and thus at a lower temperature than the dielectric reservoir 80. As previously described, the upper insert 20 within the housing 12 includes an aperture therein to permit the component gripper assembly 60 to be inserted in and removed from the high voltage test chamber 14 and provides the upper, inner portion of the test chamber with a generally concave configuration to facilitate the condensation of the dielectric vapor thereon. The dielectric vapor which condenses upon the upper insert 20 and the remaining inner walls of the test chamber 14 flows down the test chamber's walls and collects in the funnel-shaped lower portion of the test chamber to facilitate its return to the dielectric reservoir 80 via the outlet tube 86. It is in this manner that the dielectric is continuously circulated through the high voltage test chamber 14 in a substantially closed system.

The closed, circulating dielectric system utilized in the present invention has several advantages. For example, a minimum amount of dielectric is lost from the high voltage test chamber 14. Although the upper portion of the test chamber 14 includes an aperture to allow access of the component gripper assembly 60 therein, because the dielectric vapor is generally more dense and heavier than the surrounding atmosphere, the dielectric vapor tends to remain within the test chamber 14 and does not escape therefrom. Another advantage of the closed, circulating dielectric system relates to the manner in which impurities and contaminants are removed from the test chamber and not allowed to re-enter. Not only does the liquid dielectric, shown as element 87 in FIG. 1, exit the test chamber via outlet tube 86, but also any contaminants within the test chamber will collect at the bottom thereof and be deposited within the dielectric reservoir 80 via the outlet tube 86. With water removed from the surface of the liquid dielectric via the float assembly 90, only substantially pure dielectric vapor will enter the test chamber 14 via the inlet tube 84 upon the heating of the liquid dielectric within the dielectric reservoir 80. Other contaminants within the high voltage test chamber 14, such as various substances deposited on the surface of the electronic components tested therein, will be removed from the high voltage test chamber and will collect on the bottom of the dielectric reservoir 80 and may be easily removed therefrom by conventional means (not shown). By removing contaminants from the dielectric as previously described, extremely high voltages may be applied across the electrodes within the test chamber 14 without the occurrence of arcing and leakage currents due to contaminants such as water vapor within the dielectric. The closed, circulating dielectric system thus permits higher voltages to be applied across the electrodes within the test chamber while ensuring accurate measurement of even very small currents within the components being tested.

In order to reduce the possibility of escape of the dielectric vapor from the test chamber 14, the upper insert 20 positioned therein may be cooled in order to increase condensation of the dielectric vapor near the opening 18 within the lid 16 in further reducing the amount of vapor which escapes from the test chamber 14. To this end, a coolant reservoir 100 may be coupled by means of a coolant inlet line 102 and a coolant return line 106 to coolant ducts 106 and 108 within the upper insert 20 of the housing 12. The inner surface of the upper insert 20 is configured so as to facilitate the condensation of dielectric vapor thereon and its downward flow therealong and onto the inner walls of the test chamber 14 so as to collect in the lowermost portion of the bottom of the test chamber as previously described.

Also provided within the test chamber 14 is a Faraday shield 22. The Faraday shield 22 is mounted to support members 24 and 25 which, in turn, are securely fastened to the housing 12 in a lower portion of the test chamber 14. The Faraday shield 22 is interposed between the positive and negative electrodes 30, 32 and performs a "gettering" function in collecting free electrons within the high voltage test chamber 14 and directing them to neutral ground. The Faraday shield 22 thus enhances electrical isolation between the positive and negative electrodes 30, 32 and further reduces the tendency of leakage currents arising from charged particles outside of the electronic component being tested from contributing to the current measurements taken by the voltage generating and electrical measurement apparatus 50. The Faraday shield 22 is provided with a plurality of apertures therein and further includes a first slot 23 positioned between the positive and negative electrodes 30, 32 and within which the electronic component 66 is inserted for connection to the positive and negative electrodes. By substantially reducing electric currents within the test chamber 14 outside of the electronic component 66 undergoing test, the Faraday shield 22 significantly increases component testing accuracy and reliability.

Althoug the Faraday shield 22 substantially reduces electrical currents between the positive and negative electrodes which are not carried by the electronic component being tested, some current will pass through the first slot 23 therein and could contribute an erroneous input to the voltage generating an electrical measurement apparatus 50. In order to take into consideration extraneous electrical current passing through the first slot 23 within the Faraday shield 22 between the positive and negative electrodes 30, 32, a second slot 26 is provided within the Faraday shield. Positioned adjacent to the second slot 26 and coupled to the voltage generating and electrical measurement apparatus 50 via an electrical lead 28 is a reference electrode 27 as shown in FIG. 3. The reference electrode 27 detects the current passing the second slot 26 within the Faraday shield 22 and provides a signal representing this current to the voltage generating and electrical measurement apparatus 50. Since the current transiting the second slot 26 is essentially equal to the current transiting the first slot 23 of the Faraday shield 22 outside of the electronic component being tested, the signal provided from the reference electrode 27 to the voltage generating and electrical measurement apparatus 50 may be used to compensate for leakage currents within the high voltage test chamber 14 arising from the movement of charged particles therein. Therefore, by subtracting the current as measured by the reference electrode 27 from the current between the positive and negative electrodes 30, 32, an accurate measurement of the current within the electronic component is available to the voltage generating and electrical measurement apparatus 50 for presentation on the current display 54 therein.

Since conventional means may be used for subtracting a signal representing the current through the second slot 26 from the total current through the first slot 23 within the Faraday shield 22, it is not necessary to describe in detail this aspect of the voltage generating and electrical measurement apparatus 50 utilized in the present invention.

There has thus been shown a high voltage electronic component test apparatus for accurately measuring the electrical characteristics of an electronic component with a high voltage applied thereacross. The test apparatus includes a high voltage test chamber coupled to a closed, circulating liquid/vapor dielectric system for providing a high degree of isolation between high voltage electrodes within the test chamber in minimizing leakage currents and arcing therein. The closed, circulating dielectric system offers the advantages of continuous removal of contaminants from the dielectric, minimal dielectric loss, and a substantially uniform, highly predictable high voltage operating characteristic within the test chamber. The high voltage electronic component test apparatus of the present invention is particularly adapted for use with a remotely controlled, robotic component gripper assembly for the high speed, automatic testing of virtually any type of electronic component. While the present invention is disclosed in terms of the high voltage testing of axial lead electronic components such as diodes, capacitors and resistors, it has application to virtually any electronic component exhibiting an electrical characteristic which is a function of an applied voltage. Virtually any electrically inert substance having a high resistivity and which is easily changed from liquid to vapor, and vice versa, may be used in the present invention. Some examples of such dielectric materials include Freon and various fluorinated hydrocarbons such as Fluorinert.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. Apparatus for applying a high voltage across an electronic component having a pair of leads and measuring a small current therein, said apparatus comprising:
    a housing having an opening leading to a chamber therein;
    first and second electrodes positioned within said chamber and adapted for electrical contact with a respective axial lead of an electronic component inserted within said chamber through the opening in said housing;
    voltage generating and current measuring means coupled to said first and second electrodes for applying a high voltage thereacross and measuring the current within an electronic component coupled to said electrodes;
    fluid circulating means coupled to said chamber and containing a liquid dielectric for converting said liquid dielectric to vapor form and providing the vapor dielectric to said chamber for electrically isolating said first and second electrodes, wherein the vapor dielectric condenses to liquid form within said chamber and returns to said fluid circulating means for re-vaporization and return to said chamber, said fluid circulating means including a heated reservoir for receiving the dielectric in liquid form from said chamber and for converting said dielectric to a vapor for diffusion back into said chamber; and
    means within said heated reservoir for removing water from the liquid dielectric therein.

2. The apparatus of claim 1 wherein the liquid dielectric possesses a greater weight per unit volume than the water and said means for removing the water includes a float device on a surface of the dieletric and immersed in a water layer thereon in combination with a drain tube for removing the water from said reservoir.

3. Apparatus for applying a high voltage across an electronic component having a pair of leads and measuring a small current therein, said apparatus comprising:
    a housing having an opening leading to a chamber therein, wherein said opening is in an upper portion of said housing;
    first and second electrodes positioned within said chamber and adapted for electrical contact with a respective axial lead of an electronic component inserted within said chamber through the opening in said housing;
    voltage generating and current measuring means coupled to said first and second electrodes for applying a high voltage thereacross and measuring the current within an electronic component coupled to said electrodes;
    fluid circulating means coupled to said chamber and containing a liquid dielectric for converting said liquid dielectric to vapor form and providing the vapor dielectric to said chamber for electrically isolating said first and second electrodes, wherein the vapor dielectric condenses to liquid form within said chamber and returns to said fluid circulating means for re-vaporization and return to said chamber; and
    coolant means coupled to said housing adjacent to the opening therein for cooling the upper portion of said housing and facilitating the condensation of the dielectric within said chamber in reducing an escape and loss of dielectric therefrom.

4. The apparatus of claim 3 wherein said coolant means comprises a closed, circulating system containing a coolant and including a coolant carrying duct within the upper portion of said housing for reducing a temperature thereof.

5. The apparatus of claim 3 wherein the dielectric is Freon.

6. The apparatus of claim 3 wherein the dielectric is a fluorinated hydrocarbon.

7. Apparatus for applying a high voltage across an electronic component having a pair of leads and measuring a small current therein, said apparatus comprising:
    a housing having an opening leading to a chamber therein;
    first and second electrodes positioned within said chamber and adapted for electrical contact with a reapective axial lead of an electronic component inserted within said chamber through the opening in said housing;

voltage generating and current measuring means coupled to said first and second electrodes for applying a high voltage thereacross and measuring the current within an electronic component coupled to said electrodes;

fluid circulating means coupled to said chamber and containing a liquid dielectric for converting said liquid dielectric to vapor form and providing the vapor dielectric to said chamber for electrically isolating said first and second electrodes, wherein the vapor dielectric condenses to liquid form within said chamber and returns to said fluid circulating means for re-vaporization and return to said chamber;

a Faraday shield positioned within said chamber and intermediate said first and second electrodes for directing leakage currents within said chamber to neutral ground potential; and a third electrode positioned adjacent to said Faraday shield and coupled to said voltage generating and current measuring means for providing a current leakage compensating signal thereto.

8. The apparatus of claim 7 wherein said Faraday shield includes a first slot therein positioned between said first and second electrodes for receiving an electronic component coupled between said first and second electrodes.

9. The apparatus of claim 8 wherein said Faraday shield further includes a second slot and wherein said third electrode is positioned adjacent to said second slot.

10. The apparatus of claim 3 wherein the first and second electrodes each include a flexibly resilient member for maintaining electrical contact with a respective electronic component lead following initial contact therewith.

11. The apparatus of claim 3 wherein the opening in said housing is adapted to receive a movable component gripper assembly engaging an electronic component to be tested in permitting the insertion of the electronic component into said chamber and its removal therefrom.

12. The apparatus of claim 11 wherein said component gripper assembly includes first and second electrically conductive pincer means for engaging a respective component lead and for contacting a respective electrode, and wherein each of said first and second electrodes includes a flexibly resilient portion for maintaining electrical contact with a respective pincer means following initial contact therewith.

13. The apparatus of claim 3 further comprising display means coupled to said voltage generating and current measuring means for providing a visual indication of the voltage applied across said first and second electrodes and the current within the electronic component.

* * * * *